(12) United States Patent
Manning

(10) Patent No.: US 6,384,454 B2
(45) Date of Patent: May 7, 2002

(54) PROCESS FOR MANUFACTURING INTEGRATED CIRCUIT SRAM

(75) Inventor: H. Montgomery Manning, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/757,844

(22) Filed: Jan. 10, 2001

Related U.S. Application Data

(62) Division of application No. 08/854,867, filed on May 12, 1997, now Pat. No. 6,174,764.

(51) Int. Cl.$^7$ ............................................. H01L 31/113
(52) U.S. Cl. ....................... 257/368; 257/319; 257/382; 257/384; 257/388
(58) Field of Search ................................ 257/368–401, 257/314–346, 903

(56) References Cited

U.S. PATENT DOCUMENTS

| | | | |
|---|---|---|---|
| 4,868,138 A | 9/1989 | Chan et al. ............... 437/44 |
| 5,126,279 A | 6/1992 | Roberts .................... 437/52 |
| 5,173,754 A | 12/1992 | Manning .................. 257/69 |
| 5,175,127 A | 12/1992 | Manning .................. 437/195 |
| 5,196,910 A | 3/1993 | Moriuchi et al. ......... 357/23.6 |
| 5,212,399 A | 5/1993 | Manning .................. 257/369 |
| 5,215,932 A | 6/1993 | Manning .................. 437/41 |
| 5,240,874 A | 8/1993 | Roberts .................... 437/69 |
| 5,241,206 A | 8/1993 | Lee et al. ................. 257/380 |
| 5,273,924 A | 12/1993 | Chan et al. ............... 437/46 |
| 5,275,963 A | 1/1994 | Cederbaum et al. ...... 437/48 |
| 5,320,975 A | 6/1994 | Cederbaum et al. ...... 437/44 |
| 5,327,377 A | 7/1994 | Kawashima .............. 365/156 |
| 5,327,394 A | 7/1994 | Green et al. ............. 365/233.5 |
| 5,379,251 A | 1/1995 | Takeda et al. ........... 365/174 |
| 5,390,143 A | 2/1995 | Manning .................. 365/145 |
| 5,411,909 A | 5/1995 | Manning et al. ......... 437/52 |
| 5,422,499 A | 6/1995 | Manning .................. 257/67 |
| 5,461,251 A | 10/1995 | Yang et al. ............... 257/379 |
| 5,473,185 A * | 12/1995 | Pfiester et al. ........... 257/399 |
| 5,483,104 A * | 1/1996 | Godinho et al. .......... 257/758 |
| 5,485,420 A * | 1/1996 | Lage et al. ............... 365/154 |
| 5,518,939 A | 5/1996 | Negishi et al. ........... 437/40 |
| 5,545,584 A | 8/1996 | Wuu et al. ............... 437/52 |
| 5,568,435 A | 10/1996 | Marr ....................... 365/201 |
| 5,583,821 A | 12/1996 | Rose et al. ............... 365/226 |
| 5,600,588 A | 2/1997 | Kawashima .............. 365/154 |
| 5,610,856 A | 3/1997 | Yoshizumi et al. ...... 365/154 |
| 5,675,160 A | 10/1997 | Oikawa ................... 257/296 |
| 5,781,482 A | 7/1998 | Sakata .................... 365/189.11 |
| 5,818,090 A | 10/1998 | Kimura ................... 257/369 |
| 5,818,750 A | 10/1998 | Manning .................. 365/154 |

FOREIGN PATENT DOCUMENTS

| | | | |
|---|---|---|---|
| EP | 087979 | 9/1993 | |
| EP | 0562207 A1 * | 9/1993 | ........... H01L/21/82 |
| JP | 06053442 | 2/1994 | |
| JP | 6291281 | 10/1994 | ........... H01L/27/11 |
| JP | 7130876 | 5/1995 | ....... H01L/21/8244 |
| JP | 07130876 | 5/1995 | |
| JP | 7130877 | 5/1995 | ....... H01L/21/8244 |
| JP | 07130877 | 5/1995 | |
| JP | 7273222 | 10/1995 | ....... H01L/21/8244 |
| JP | 8186181 | 7/1996 | ....... H01L/21/8244 |

OTHER PUBLICATIONS

"ISSCC Digital ICs", *Electronic Design*, 37, No. 4, Hasbrouck Heights, MJ, US, pp. 49–53, (Feb. 23, 1989).

* cited by examiner

*Primary Examiner*—Nathan Flynn
*Assistant Examiner*—Scott R. Wilson
(74) *Attorney, Agent, or Firm*—Schwegman, Lundberg, Woessner & Kluth, P.A.

(57) ABSTRACT

An SRAM cell is described which has a reduced cell area, and a reduced processing cost from conventional SRAM's. A fabrication process is described where self-aligned contacts to substrate active area and contact to a first layer of polysilicon are formed in one etch step. Electrical connection between the substrate and polysilicon is provided through a conductive layer coupled to the contacts. Self aligned contacts are fabricated to contact the active area.

38 Claims, 12 Drawing Sheets

PROCESS FOR MANUFACTURING INTEGRATED CIRCUIT SRAM

This application is a Divisional of U.S. Ser. No. 08/854,867 filed May 12, 1997 now U.S. Pat. No. 6,174,764.

FIELD OF THE INVENTION

The present invention relates generally to a low-cost method for fabricating devices and integrated circuits with reduced cross-sectional area, and more specifically to a low-cost method for fabricating a static random access memory (SRAM) having reduced cross-sectional area.

BACKGROUND OF THE INVENTION

Electronics technology has proliferated with the advent of inexpensive and high performance integrated circuits, including communication transceivers, microprocessors, and memory. As a result, complex electronic systems, such as personal computers and cellular telephones have become widely held consumer goods.

Integrated circuits are fabricated with multiple processing steps. Integrated circuits are often fabricated with one or more device types including diodes, capacitors, and different varieties of transistors. These devices often have microscopic features that can only be manufactured with critical processing steps that require careful alignment of equipment used to build the devices. The critical processing steps are expensive because they must be accomplished with costly and sophisticated equipment, and experienced operators. When a processing step, particularly a critical processing step, is unsuccessful, the device and integrated circuit may fail. As a result, fabrication yields decrease. Therefore, a process with a diminished number of critical processing steps to reduce production costs is desirable.

Further, prior art typically uses Buried Contacts (BC) that connect a first conductor to substrate active area. The BC process however is a lower yielding process than the self aligned contacts described herein. In addition, BC's require full enclosure by the first conductor which requires additional area, thereby increasing the cell size.

Additionally, it is preferable to reduce the cross-sectional area of devices and integrated circuits. When device and integrated circuit cross-sectional area is reduced, more devices and integrated circuits can be produced on a single substrate. As a result, device and integrated circuit fabrication costs decrease. Therefore, a low cost process with fewer critical processing steps for fabricating devices and integrated circuits with reduced cross-sectional areas is desirable. An integrated circuit is also needed which electrically couples substrate active area with a conductor without the need for a buried contact.

SUMMARY OF THE INVENTION

In accordance with the present invention, there is provided a method of fabricating devices having smaller cross-sectional areas with fewer critical processing steps. One embodiment of the present invention permits fabrication of an SRAM with fewer processing steps. Further features and advantages of the present invention, as well as the structure and operation of various embodiments of the present invention are described in detail below with reference to the accompanying drawings.

A static random access memory (SRAM) device is described which comprises a self-aligned electrical contact to semiconductor active area and a second electrical contact to a non-active area electrically conductive structure. The self-aligned electrical contact and the second electrical contact are defined by a process comprising a single dielectric etch step.

In another embodiment, a method of fabricating electrical interconnects in a static random access memory (SRAM) cell is described. The method comprises the steps of forming first and second dielectric-conductor-dielectric layered structures, and a dielectric-conductor layered structure on a semiconductive base. Vertical dielectric structures are formed and attach to exposed vertical surfaces of the first and second dielectric-conductor-dielectric structures and the dielectric-conductor structure. A dielectric layer is formed over the first and second dielectric-conductor-dielectric structures, the dielectric-conductor structure, and exposed semiconductive base between the first and second structures. A single etch step is performed on the dielectric layer to define a self aligned contact to the semiconductive base located between the first and second dielectric-conductor-dielectric structures, and a contact to the conductor of the dielectric-conductor structure.

BRIEF DESCRIPTION OF THE DRAWINGS

The present invention is described with reference to the accompanying drawings. In the drawings, like reference numbers indicate identical or functionally similar elements.

DETAILED DESCRIPTION OF THE EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

The present invention is directed towards facilitating low-cost fabrication of devices and integrated circuits. This goal is achieved by reducing the cross-sectional area of devices and integrated circuits, and fabricating the devices and integrated circuits with fewer critical processing steps.

Figure 1:
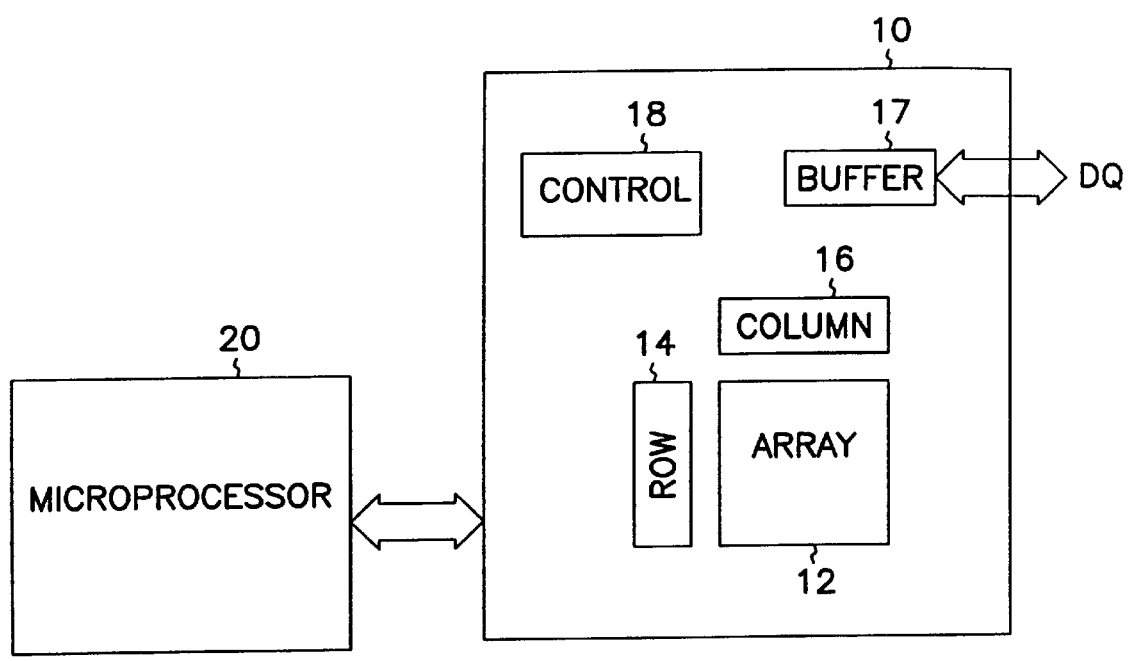
FIG. 1 is a block diagram of a memory device of the present invention.

Referring to FIG. 1, the basic static memory 10 is well known in the art to include a memory array 12 constructed of rows and columns of static memory cells having inputs and outputs corresponding to rows and columns. Row decode circuit 14 and column 16 decode circuitry is provided to access the memory array in response to an address provided by an external controller 20, such as a standard microprocessor. Control circuitry 18 is provided to control either synchronous or asynchronous data communication between the memory 10 and external devices. Buffers are coupled to the data communication lines (DQ's) for bi-directional data communication with the memory array 12. It will be appreciated that the description of SRAM 10 has been simplified to focus on specific features of the present invention and is not intended to be a detailed description of all the circuitry of a basic SRAM.

Basic SRAM Cell

Figure 2:
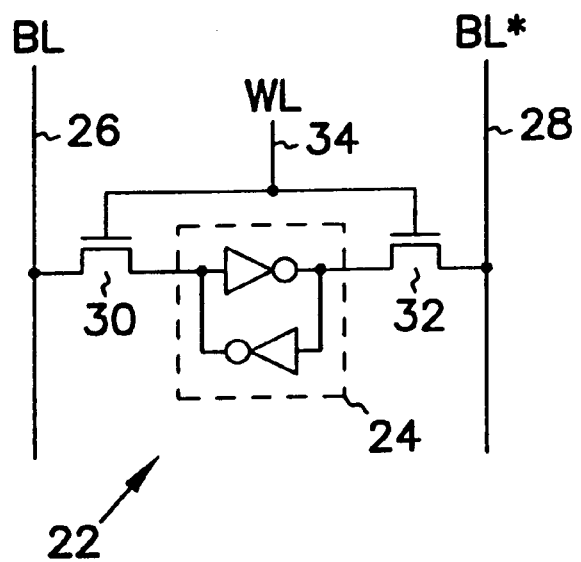
FIG. 2 is a schematic diagram of a basic static memory cell.
Figure 3:
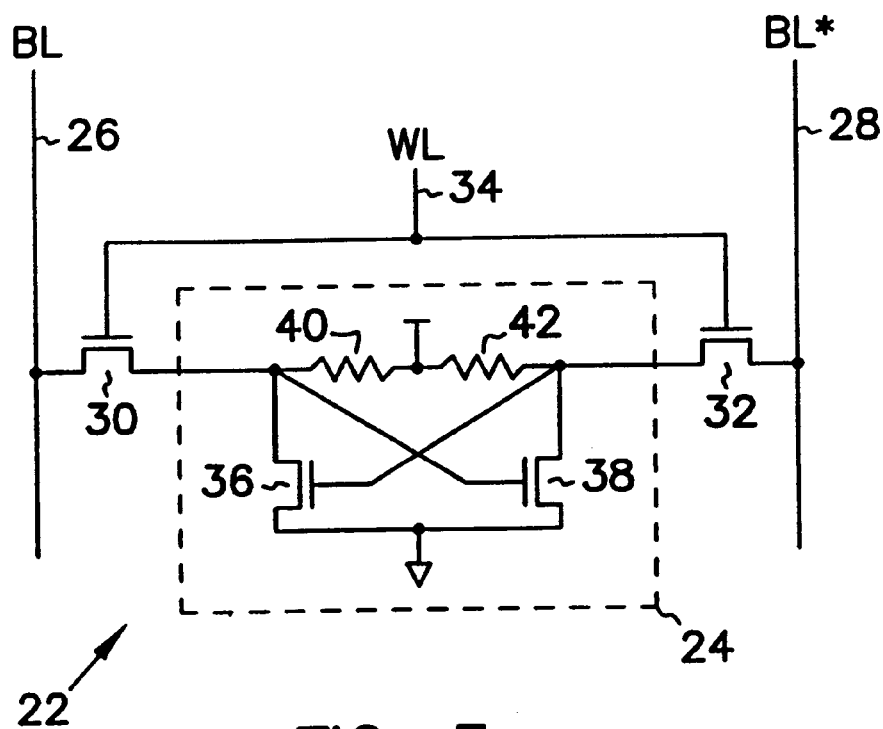
FIG. 3 is a more detailed schematic diagram of the static memory cell of FIG. 2.

FIG. 2 illustrates a functional diagram of a static memory cell 22. The memory cells operate as a data latch 24 which can be connected to complementary bit lines 26 and 28 by activating access transistors 30 and 32 using a common word line 34. The static memory cell can be fabricated as shown in FIG. 3 having two cross coupled pulldown transistors 36 and 38. To write data to the memory cell, the access transistors 30 and 32 are activated by providing a signal on the word line 34. Voltages provided on the complimentary bit lines 26 and 28 are sufficient to place the latch in a state corresponding to the bit lines. If the memory cell was storing data of an opposite logic state, the bit line voltages toggle the latch 24 by overpowering bias currents through pull-up resistors 40 and 42. That is, if bit line 26 is at a high potential and bit line 28 is at a low potential when the word line transitions to a high potential, transistor 38 is activated and transistor 36 is turned off. To read a memory cell, the access transistors are activated to couple the pulldown transistors 36 and 38 to bit lines 26 and 28. Sense amplifier circuitry (not shown) is provided to detect and amplify a differential voltage provided on the bit lines. It will be understood that the SRAM 10 is fabricated as an integrated circuit and that a minimum memory cell layout is desired to maximize memory density.

Figure 4:
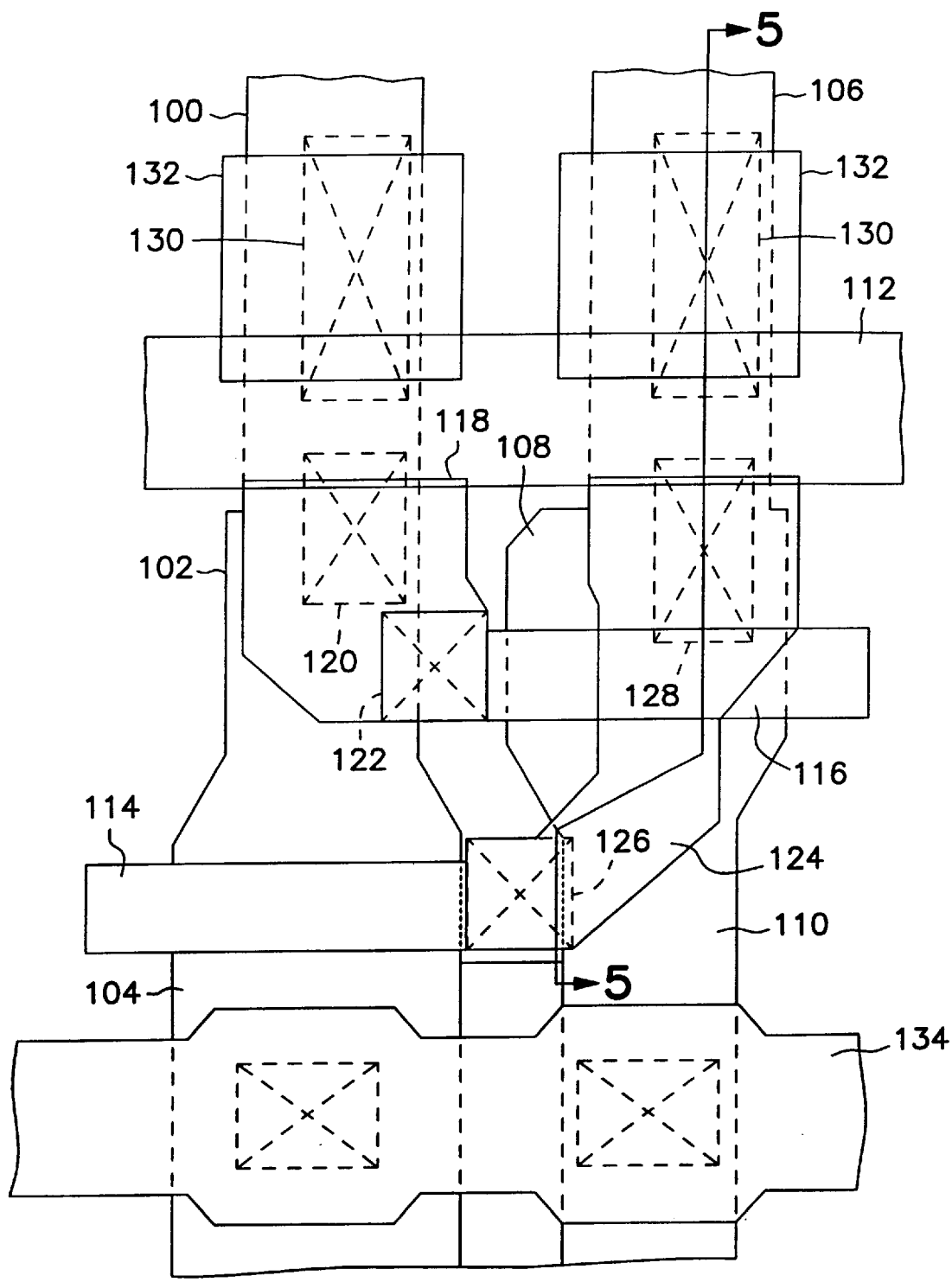
FIG. 4 is a plan view of a static memory cell of the present invention.

FIG. 4 is a plan view of a single word line SRAM memory cell of the present invention fabricated such that current flows from Vss to bit line contacts entirely in active area. The gates of both pulldown transistors are fabricated essentially parallel to the common word line.

Referring to FIG. 4, a static memory cell is shown which has a first access transistor fabricated using active area regions 100 and 102 as drain and source regions, respectively. A polysilicon gate is fabricated as a common word line 112 which also forms a gate for a second access transistor. The second access transistor is defined by drain and source regions 106 and 108, respectively, formed using continuous active area. The source of each access transistor is integrally connected to a pulldown transistor. The source of the first access transistor is connected to the drain of a first pulldown transistor defined by active area 102 which acts as a drain region, active area 104 which operates as a source region, and a polysilicon gate 114. Likewise, the source of the second access transistor is connected to the drain of a second pulldown transistor defined by active area 108 which acts as a drain region, active area 110 which operates as a source region, and a polysilicon gate 116. The source region of each pulldown transistor is connected to a supply voltage, preferably VSS. It will be appreciated that in these described embodiments, an SRAM cell using such devices for pull-down and access devices may just as easily be constructed using p-channel devices where Vcc is substituted for Vss and the polarities of signals are reversed.

The pulldown transistor drain 102 is connected to the gate poly 116 of the second pulldown transistor through a second polysilicon layer 118 and two contacts. The second layer of polysilicon 118 is connected to the active area region 102 through a self-aligned contact 120, as known to those skilled in the art. The gate 116 is connected to second polysilicon layer 118 through a cell contact 122. The second pulldown transistor drain 108 is connected to the gate 114 of the first pulldown transistor through a second polysilicon layer 124 and a cell contact 126. Likewise, second polysilicon layer 124 is connected to active area 108 through a self-aligned contact 128. Self-aligned contacts 130 are preferably used to connect active areas 100 and 106 to second layers of polysilicon 132 which can be connected to complementary bit lines (not shown) through their use as landing pads for subsequently formed bit line contacts.

An polysilicon second layer 134 is provided to strap the VSS active area connected to the source regions of the pulldown transistors. Active areas 100, 102 and 104 are a continuous strip. Likewise, active areas 106, 108 and 110 are a continuous strip. These strips are coupled through polysilicon second layer 134. It will be appreciated by those skilled in the art that polysilicon second layer 134 can be eliminated and active area regions 100, 102, 104, 106, 108 and 110 can be formed from a single uninterrupted active area, where the continuous strips are connected at the source of the pulldowns (Vss). It is also possible to form the active area pattern in a continuous pattern as described above and still use polysilicon second layer 134 to strap the Vss active are to reduce it's resistance.

In this arrangement, the active area is aligned in strips to reduce two-dimensional encroachment corners which exist in the prior single word line memory cell. Cross coupling of the pulldown transistor gates to the other pulldown transistor's drain is done using cell contacts and a second level of interconnect poly. This interconnect poly does not carry any appreciable current since it is only used to charge up the pulldown gates. Therefore, variability in the internal contact's resistance does not cause cell stability failure. The use of a single word line greatly reduces the area required for the cell while still enabling a very symmetrical cell (in terms of device characteristics versus misalignment). This is due to the elimination of the internal cell contacts that carry current from VSS to the bit lines.

Figure 5:
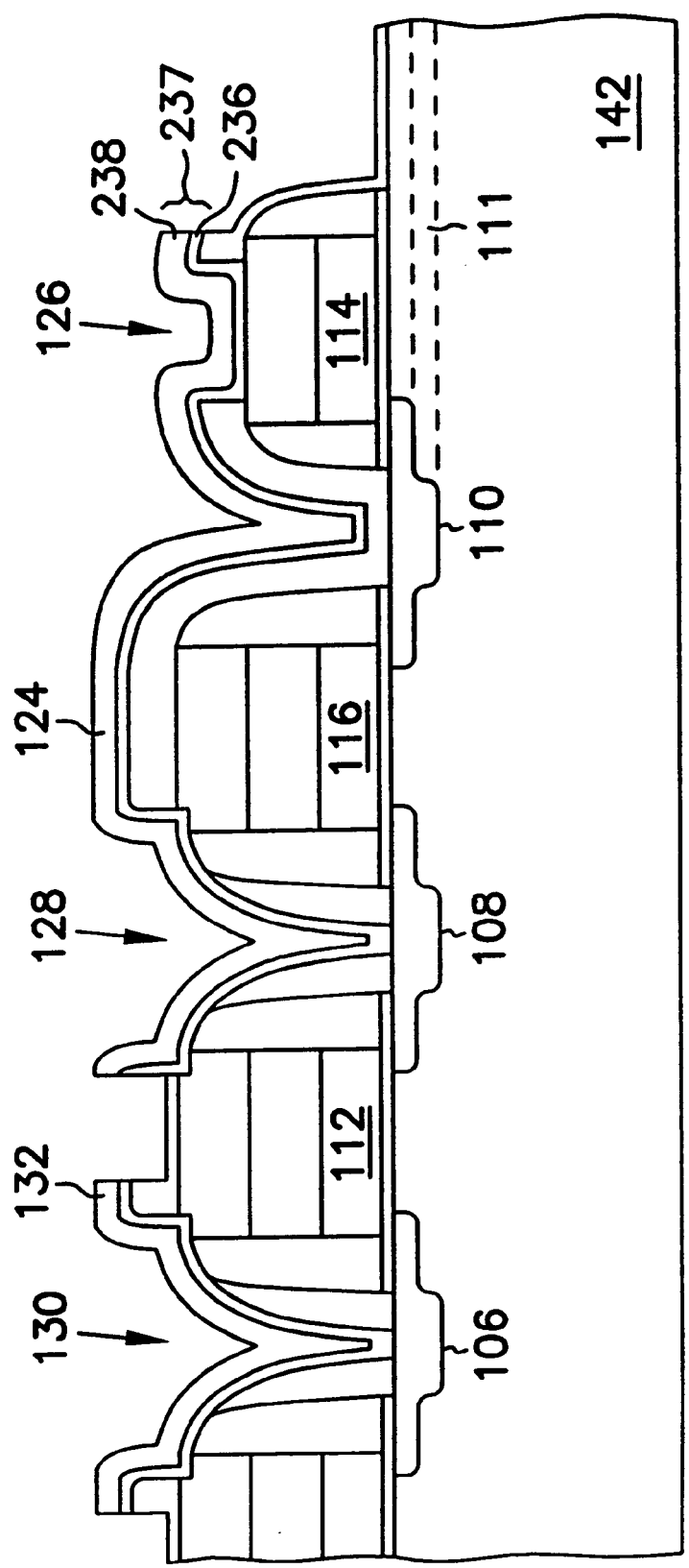
FIG. 5 is a cross-section of the static memory cell of FIG. 4.

FIG. 5 is a cross section of the memory cell of FIG. 4 along line 5—5. The single active area of substrate 142 connects the source region 110/111 of the second pulldown transistor to the self-aligned contact 130 which is coupled to the bit line poly 2 contact area 132. Region 108 is connected to the first pulldown transistor gate 114 through contact 128, poly layer 124 and cell contact 126.

Figure 6:
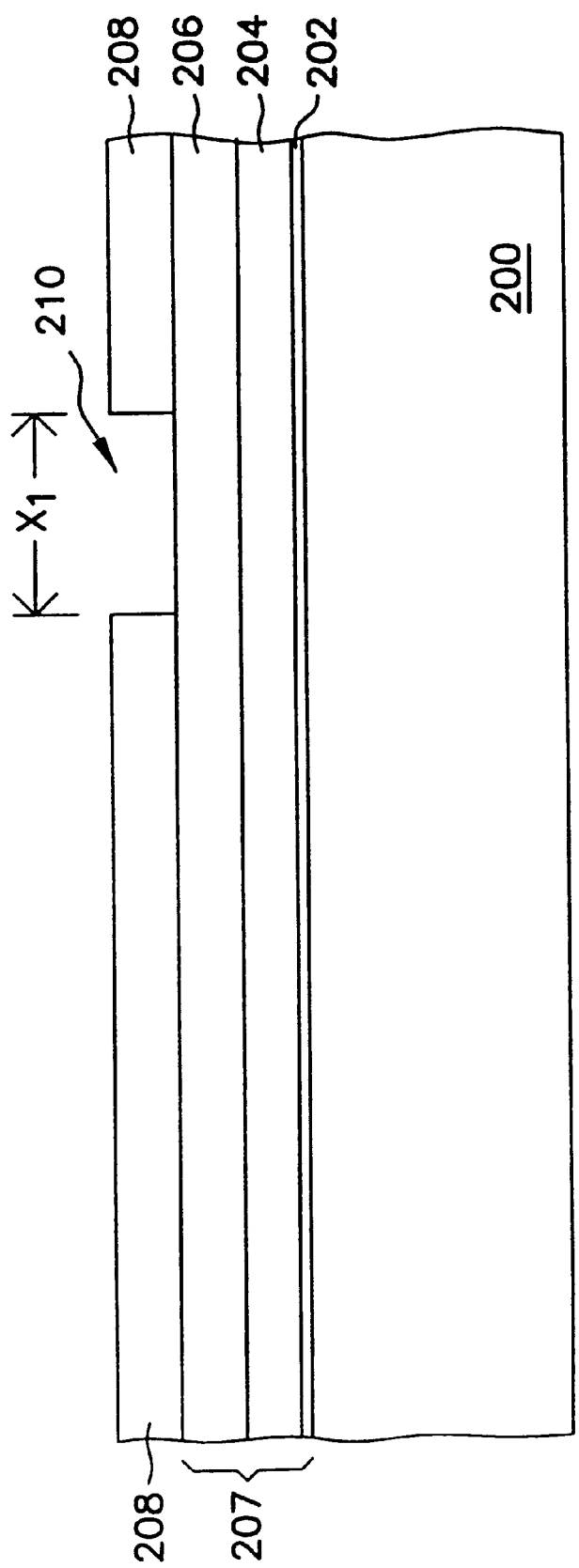
FIGS. 6–10 are a cross-section views of the static memory cell of FIG. 4 during fabrication.
Figure 7:
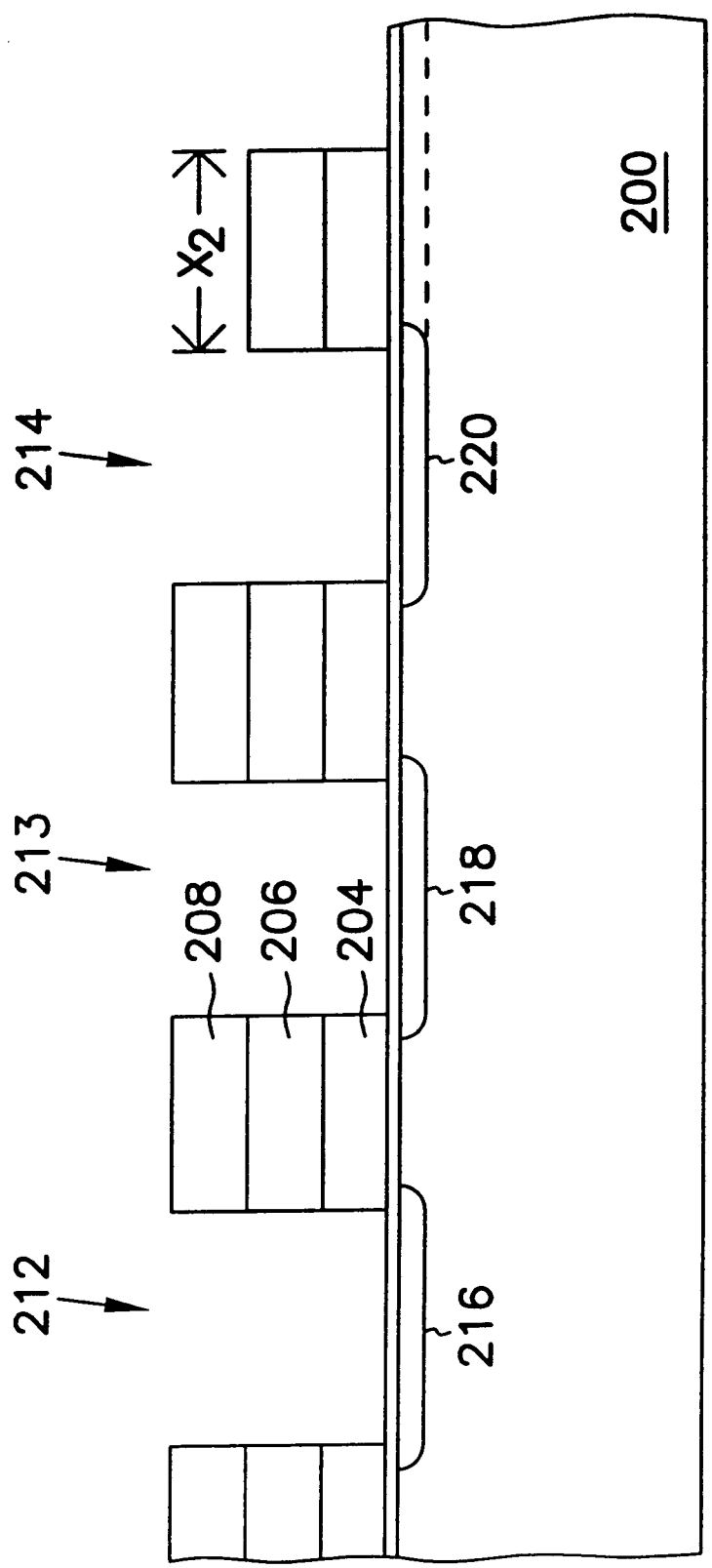

A detailed description of a preferred method of fabricating the above described SRAM cell is provided as follows with reference to FIGS. 6–10. Referring to FIG. 6, a base layer 200, or substrate, is first processed to form n-wells, p-wells, and device isolation regions by known processing means. For example, LOCOS, poly buffered LOCOS (PBL) and shallow trench isolation (STI) processes can be employed. Next, threshold adjust implants and field isolation implants are performed into desired locations. A gate oxide layer 202 is formed on the base layer 200. A first conductive layer 204 is fabricated on the layer of gate oxide. The first conductor material is preferably deposited polysilicon, referred to as the poly one layer. The polysilicon is doped, either during the deposition, or at some point after deposition. A layer of silicide 206, such as tungsten silicide, is fabricated on top of the poly one layer 204. A conductive stack layer, therefore, is formed by the poly one layer and the layer of silicide. This stacked conductor is referred to herein as the first conductor 207. It will be appreciated by those skilled in the art that the first conductor can be a single layer instead of a conductive stack.

A capping layer of oxide 208 is fabricated over the first conductor. Areas of the capping layer are selectively removed using known techniques, such as a resist mask combined with a subsequent etch process, to expose portions of the first conductor in opening 210. This opening will allow later contact between the first conductor and the self aligned contact 126. After the capping layer has been selectively removed, the capping layer 208 and first conductor layer of silicide 206 and poly one 204 are removed to expose areas of oxide 202 at regions 212, 213 and 214, see FIG. 7. Again, known techniques for removing these layers can be used. In the preferred embodiment, the opening 210 in the capping layer 208 (shown as $X_1$) is wider than the resultant first conductor width $X_2$. That is, the capping oxide is patterned so that no oxide remains on the top of selected portions the first conductor after the first conductor is patterned to expose the substrate. By making the opening wide, some misalignments can be tolerated when removing the first conductor 207. It will be appreciated that in alternate embodiments $X_1$ may be fabricated to be smaller than the resultant first conductor width $X_2$. Thus oxide can remain on the top of selected portions the first conductor.

An ion implant step may be performed to form optional LDD active regions in the exposed areas of the substrate 216, 218 and 220. This implant step can be performed through the thin oxide layer 202.

Figure 8:
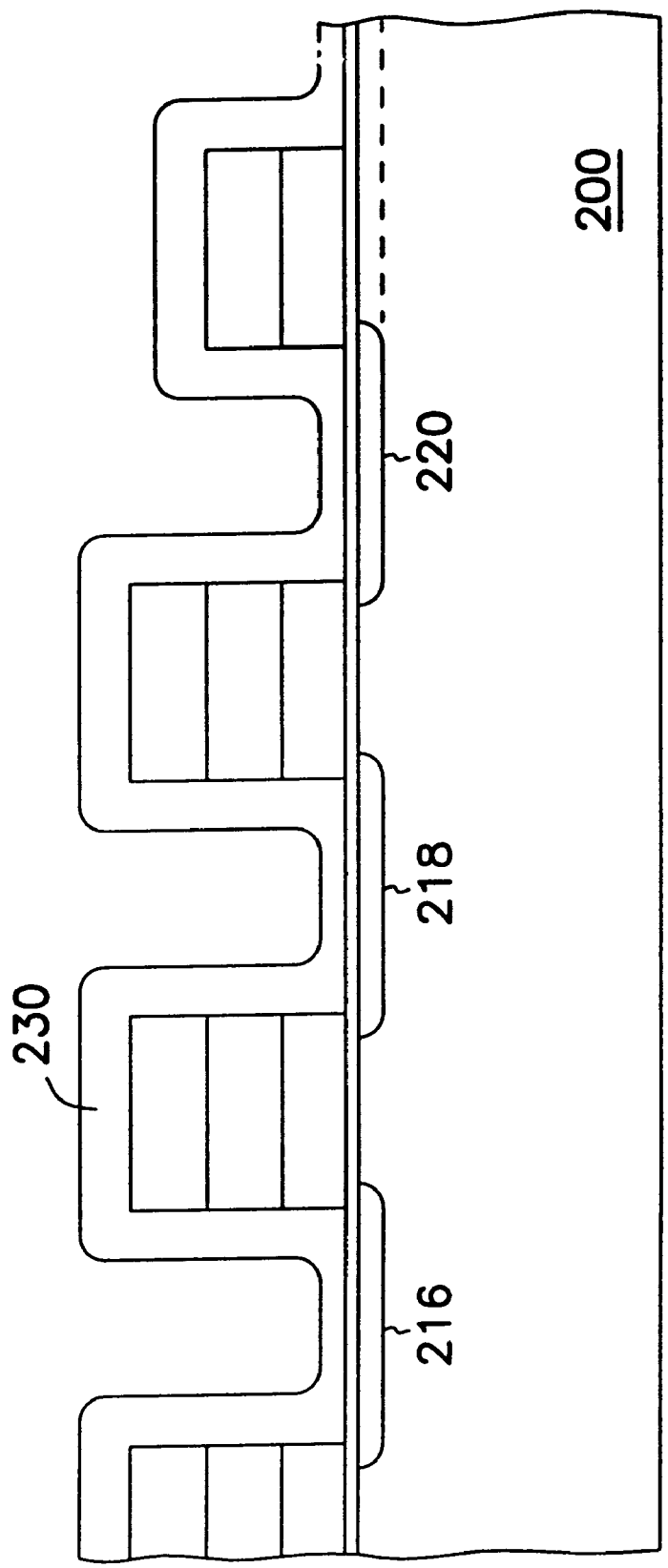
Figure 9:
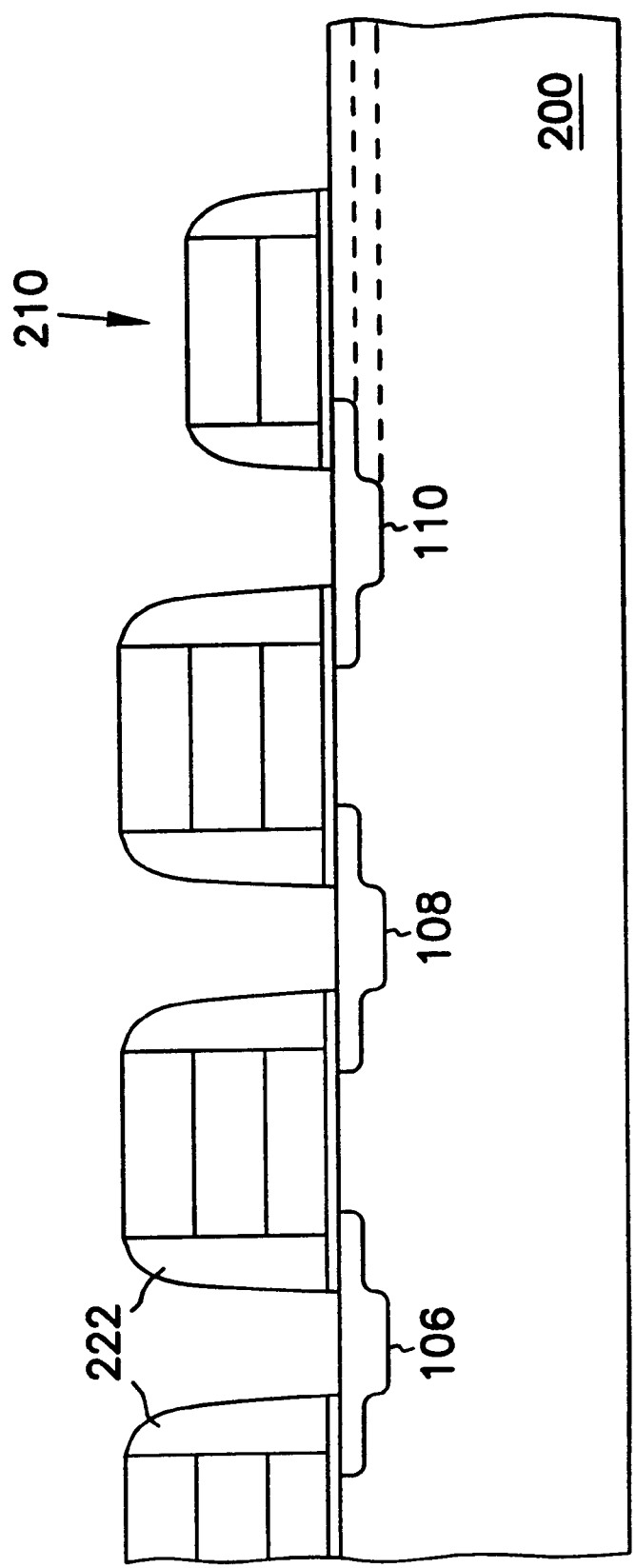

A layer of oxide 230 is then deposited over the substrate 200, first conductor 207, and capping layer 208, see FIG. 8. An anisotropic step is then performed to remove the deposited oxide from the horizontal surfaces. After the etch is complete, oxide areas 222 (see FIG. 9) remain in the vertical direction on the side walls of the capping layer and first conductor. At this point in the fabrication process, the first conductor is completely enclosed by dielectrics except for the region 210 where the capping layer was removed prior to patterning the first conductor. Oxide layer 202 is also etched to expose areas of the substrate.

A second ion implant is then performed to complete transistor source and drain regions 106, 108 and 110. This implant is a higher concentration than the earlier implant used to form the LDD regions. It will be appreciated that either, or both, the first or second implant step can be eliminated without departing from the present invention. If both implants are eliminated, then source and drain doping in selected regions may be provided through out-diffusion of dopants from the second poly layer.

Figure 10:
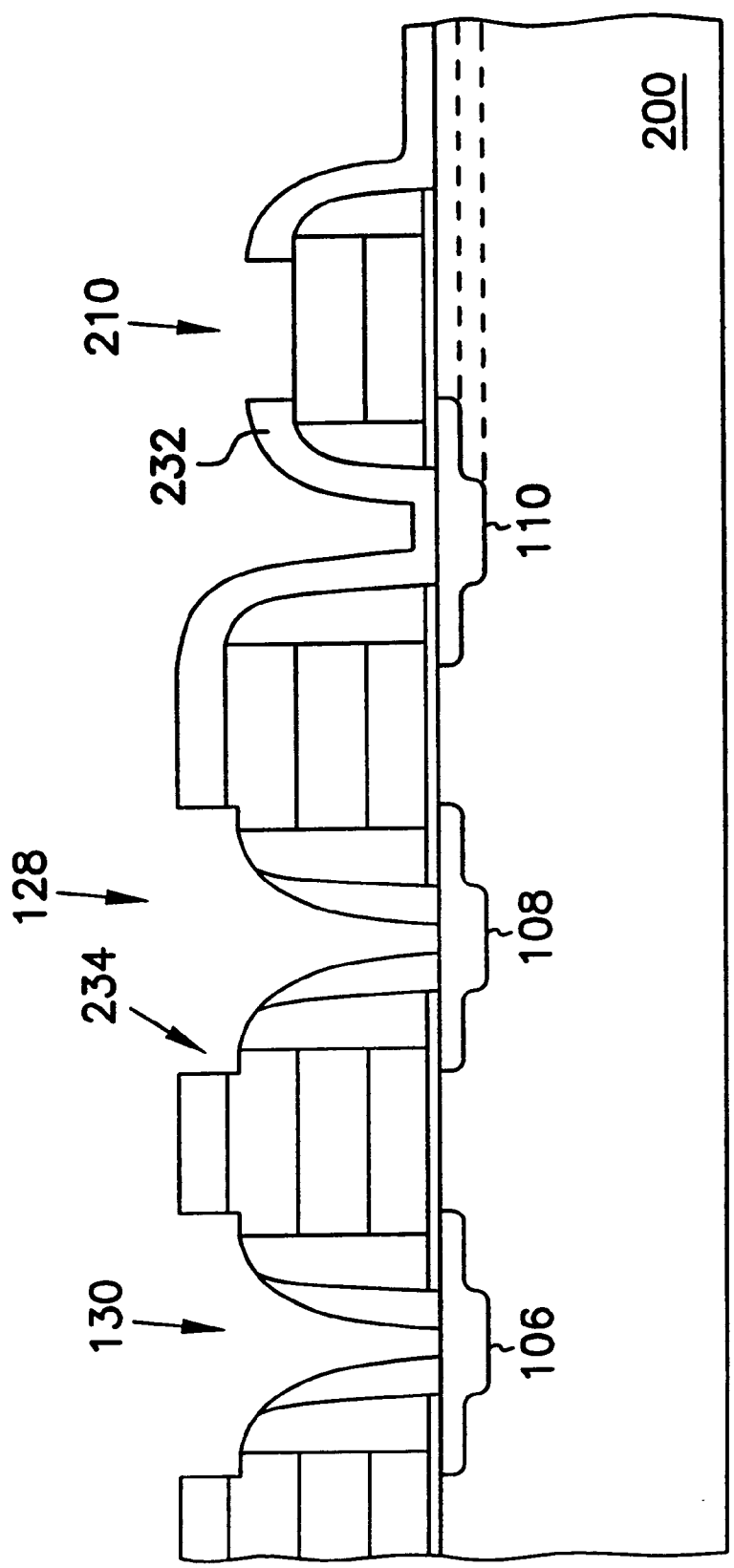
Figure 11:
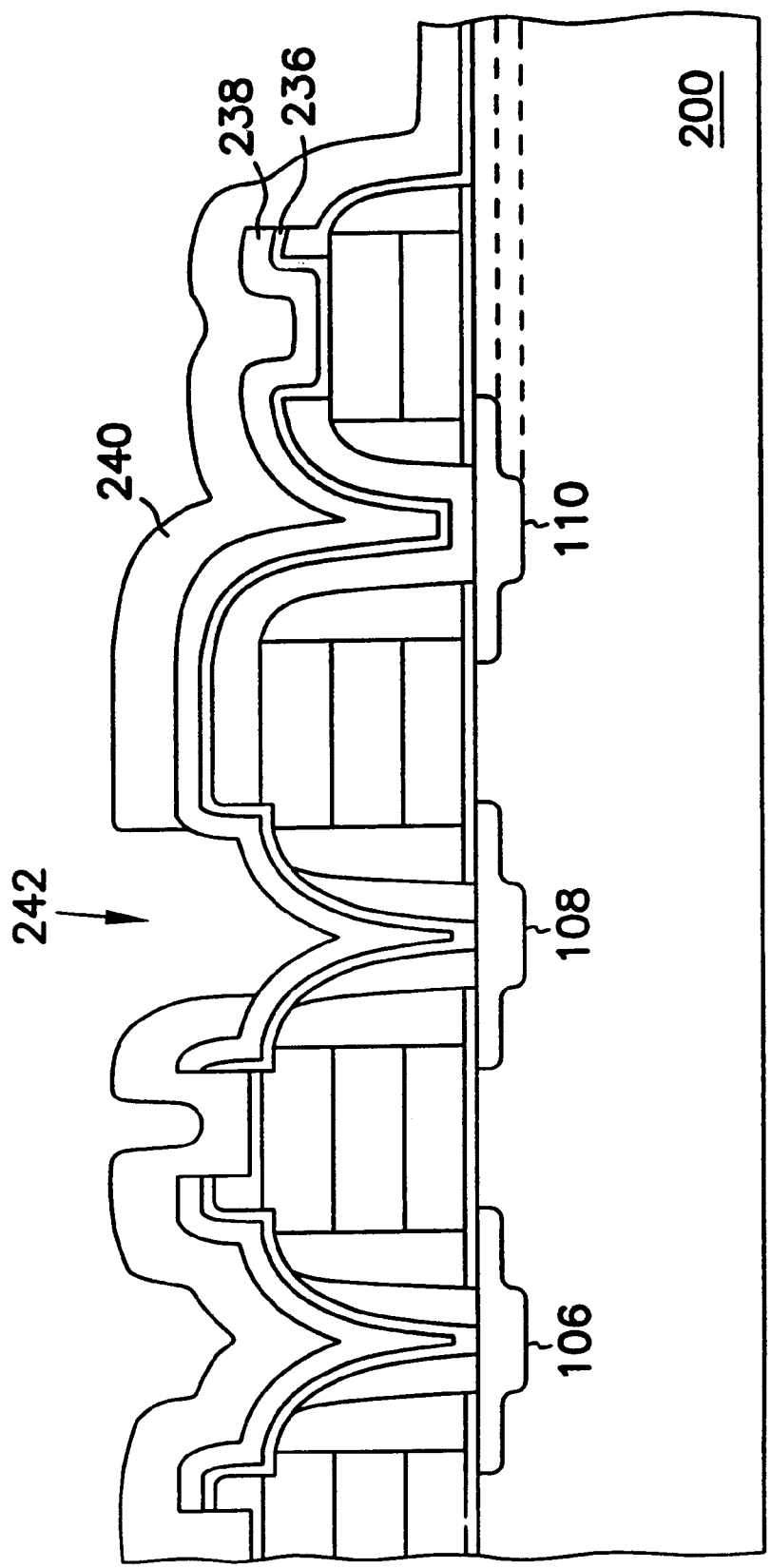
FIGS. 11 and 12 are cross-sections of the static memory cell of FIG. 4 illustrating the fabrication of a third layer of polysilicon.
Figure 12:
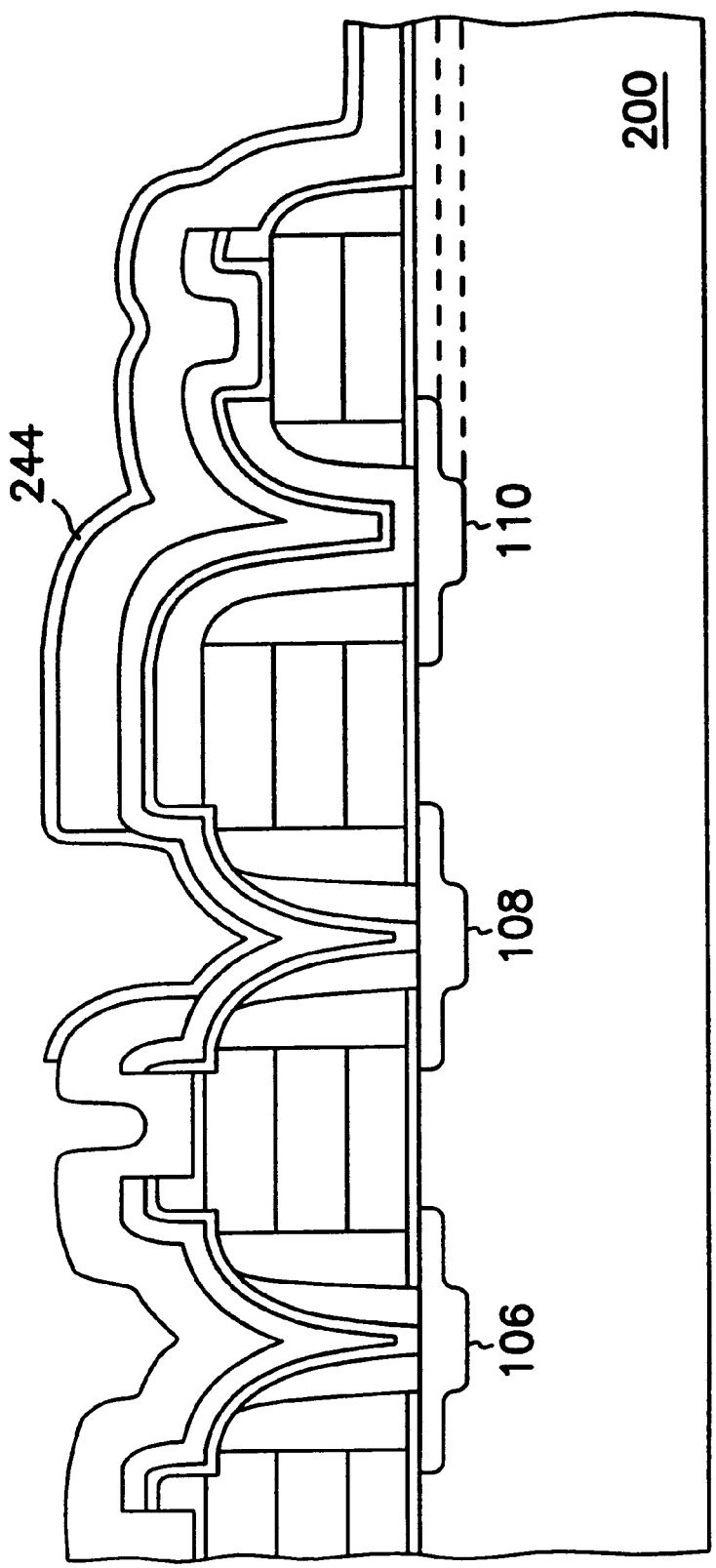
Figure 13:
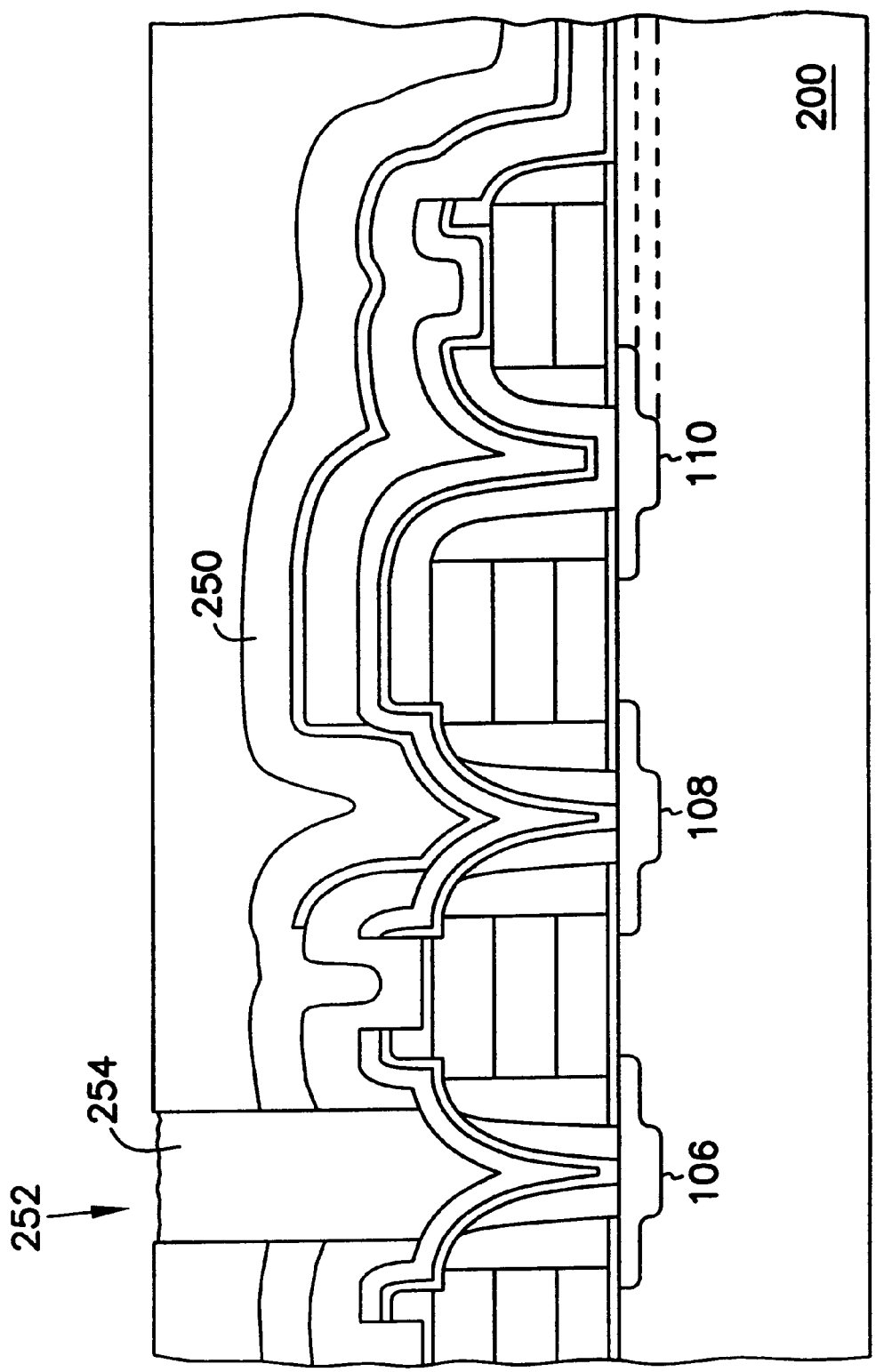
FIG. 13 illustrates the fabrication of a final dielectric layer and contact to FIG. 12.

Referring to FIG. 10, a dielectric layer 232 is deposited over the circuit as an isolation barrier for a later fabricated second conductor. The dielectric is preferably TEOS, but can be any dielectric material such as nitride, or oxide. The dielectric layer is patterned and etched to expose substrate regions 106 and 108 for the formation of exhumed contacts 128 and 130. The pattern for the etch extends over the first conductor features to insure that the small regions between the first conductor are uncovered, even upon misalignment of the pattern. Because the capping oxide layer is fabricated to be thicker than the amount of over etch required to clear the oxide from the active area in regions 106 and 108, the first conductor is not exposed during this etch step, see area 234. The dielectric is also removed above the first conductor where the capping layer was removed (region 210) to expose the first conductor layer for the formation of another exhumed contact 126. The contacts to both active area and the poly one layer are therefore formed in one etch step.

The above described oxide etch step is used to create contact regions to transistor drain area 106, source area 108 and first conductor 114. The exhumed contacts to areas 106 and 108 are referred to herein as self aligned. The exhumed contact to first conductor 114 is referred to herein as a poly contact.

A second conductor 237 is formed such that it overlays the dielectric and makes contact to exposed active areas and the first exposed conductor 114, see When used to form an SRAM cell, this process allows the second conductor 237 to cross couple the inputs and outputs of the SRAM cell's internal invertors since it makes contact to both the first conductor 207 and active area. As stated above, prior art typically uses Buried Contacts (BC) that connected the first conductor to active area. The BC process however is a lower yielding process than the self aligned contacts described herein. Further, BC's require full enclosure by the first conductor which requires additional area, thereby increasing the cell size.

The second conductor 237 may also be used to carry VSS into the cell, as well as being used as landing pads for final contacts into the cell. When used in this way, a three-poly cell is possible. Current art typically uses four levels of poly. If a BC is used, five layers of polysilicon and two poly depositions for poly one layer are required. This process then, in addition to reducing cell area, also reduces process costs.

Conclusion

An SRAM cell is described which has a reduced cell area, and a reduced processing cost from conventional SRAM's. A fabrication process is described where self-aligned contacts to substrate active area and contact to a first conductor are formed in one etch step. Electrical connection between the substrate and polysilicon is provided through a conductive layer coupled to the contacts.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A SRAM device comprising interconnected first and second access transistors and first and second pulldown transistors, each having source, drain, and gate contacts, and an interconnection comprising a continuous layer of conductive material extending directly between the drain of one of the pulldown transistors and the gate of the other pulldown transistors, and a layer of silicided material extending substantially the entire length of the conductive material.

2. The device of claim 1 where the interconnection comprises a layer of a conductor and a layer of a silicide.

3. The device of claim 2 where the conductor is polysilicon.

4. The device of claim 2 where the silicide is tungsten silicide.

5. A SRAM device comprising interconnected first and second access transistors and first and second pulldown transistors, each having source, drain, and silicide gate contacts, and an interconnection comprising a continuous layer of conductive material extending directly between the drain of one of the pulldown transistors and the gate of the other pulldown transistors.

6. The device of claim 5 where the gate contacts of all the transistors comprise a layer of a conductor and an overlying layer of a silicide.

7. The device of claim 6 where the conductor is polysilicon.

8. The device of claim 6 where the silicide is tungsten silicide.

9. The device of claim 5 where the interconnect includes a silicide distinct from all of the silicided gate contacts.

10. A SRAM device comprising interconnected first and second access transistors and first and second pulldown transistors, each having source, drain, and gate contacts, and an interconnection comprising a continuous layer of conductive material extending directly between the drain of one of the pulldown transistors and the gate of the other pulldown transistors and overlying the gate of the one pulldown transistor.

11. The device of claim 10 where the interconnection is not electrically coupled to the gate of the one pulldown transistor.

12. The device of claim 10 further comprising a single active area serving as both the drain of one of the access transistors and the source of the one pulldown transistor.

13. The device of claim 12 where the interconnection further overlies the source of the one pulldown transistor.

14. A SRAM device comprising interconnected first and second access transistors and first and second pulldown transistors, each having source, drain, and silicided gate contacts, and an interconnection comprising a continuous layer of conductive material extending directly between the drain of one of the pulldown transistors and the gate of the other pulldown transistors, and a layer of silicided material extending substantially the entire length of the conductive material.

15. The device of claim 14 where the interconnection comprises a layer of a conductor and a layer of a silicide.

16. The device of claim 15 where the conductor is polysilicon.

17. The device of claim 14 where the gate contacts of all the transistors comprise a layer of polysilicon and an overlying layer of silicide.

18. The device of claim 17 where the silicide is tungsten silicide.

19. A SRAM device comprising interconnected first and second access transistors and first and second pulldown transistors, each having source, drain, and gate contacts, and an interconnection comprising a continuous layer of conductive material extending directly between the drain of one of the pulldown transistors and the gate of the other pulldown transistors, and a layer of silicided material extending substantially the entire length of the conductive material, the interconnection further overlying the gate contact of the one pulldown transistors.

20. The device of claim 19 where the interconnection comprises a layer of a conductor and a layer of a silicide.

21. The device of claim 20 where the conductor is polysilicon.

22. The device of claim 18 where the interconnection further overlies the source of the one pulldown transistor.

23. The device of claim 22 where the interconnection couples directly to a single active area serving as both the drain of one of the access transistors and the source of the one pulldown transistor.

24. A SRAM device comprising interconnected first and second access transistors and first and second pulldown transistors, each having source, drain and silicided gate contacts, and an interconnection comprising a continuous layer of conductive material extending directly between the drain of one of the pulldown transistors and the gate of the other pulldown transistor, the interconnection further overlying the gate contact of the one pulldown transistor.

25. The device of claim 24 where the gate contacts of all the transistors comprise a layer of a conductor and an overlying layer of a silicide.

26. The device of claim 25 where the conductor is polysilicon.

27. The device of claim 24 where the interconnect includes a silicide distinct from all of the silicide gate contacts.

28. A SRAM device comprising interconnected first and second access transistors and first and second pulldown transistors, each having source, drain, and silicided gate contacts, and an interconnection comprising a continuous layer of conductive material extending directly between the drain of one of the pulldown transistors and the gate of the other pulldown transistors, and a layer of silicided material extending substantially the entire length of the conductive material, the interconnection further overlying the gate contact of the one pulldown transistor.

29. The device of claim 28 where the interconnection comprises a layer of a conductor and a layer of a silicide.

30. The device of claim 28 where the conductor is polysilicon.

31. The device of claim 28 where the gate contacts of all the transistors comprise a layer of a conductor and an overlying layer of a silicide.

32. The device of claim 28 where the interconnect includes a silicide distinct from all of the silicide gate contacts.

33. The device of claim 28 where the interconnection further overlies the source of the one pulldown transistor.

34. The device of claim 28 further comprising a single active area serving as both the drain of one of the access transistors and the source of the one pulldown transistor.

35. A SRAM memory array having rows and columns of cells, each cell having first and second access transistors and first and second pulldown transistors, each having source, drain, and gate contacts, and an interconnection comprising a continuous layer of conductive material extending directly between the drain of one of the pulldown transistors and the gate of the other pulldown transistors, and a layer of silicided material extending substantially the entire length of the conductive material.

36. The memory array of claim 35 where all of the gate contacts comprise a layer of conductive material and an overlying layer of silicide.

37. The memory array of claim 36 where the interconnection overlies the gate of the one pulldown transistor.

38. The memory array of claim 35 where the interconnection overlies the gate of the one pulldown transistor.

* * * * *

UNITED STATES PATENT AND TRADEMARK OFFICE
CERTIFICATE OF CORRECTION

PATENT NO. : 6,384,454 B2
DATED : May 7, 2002
INVENTOR(S) : H. Montgomery Manning It is certified that error appears in the above-identified patent and that said Letters Patent is hereby corrected as shown below:

Title page,
Item [56], References Cited, U.S. PATENT DOCUMENTS, delete "7/1994" and insert -- 7/1997 --, therefor.

Column 4,
Line 20, delete "An" and insert -- A --, therefor.

Column 7,
Line 3, delete "silicide" and insert -- silicided --, therefor.

Column 8,
Line 21, delete "silicide" and insert -- silicided --, therefor.
Line 41, delete "silicide" and insert -- silicided --, therefor.

Signed and Sealed this

Twenty-sixth Day of November, 2002

*Attest:*

*Attesting Officer*

JAMES E. ROGAN
*Director of the United States Patent and Trademark Office*